United States Patent
Taito et al.

(10) Patent No.: US 7,779,333 B2
(45) Date of Patent: Aug. 17, 2010

(54) SEMICONDUCTOR MEMORY HAVING EMBEDDED MICROCOMPUTER WITH ECC FUNCTION

(75) Inventors: Yasuhiko Taito, Tokyo (JP); Masashi Muto, Tokyo (JP); Eiji Sakuma, Itami (JP); Tsukasa Oishi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 891 days.

(21) Appl. No.: 11/651,075

(22) Filed: Jan. 9, 2007

(65) Prior Publication Data

US 2007/0226597 A1    Sep. 27, 2007

(30) Foreign Application Priority Data

Mar. 8, 2006  (JP)  ............... 2006-062650

(51) Int. Cl.
*G11C 29/00* (2006.01)
(52) U.S. Cl. ............... 714/763; 365/200; 365/201; 365/185.09
(58) Field of Classification Search ......... 714/763, 714/766, 785; 365/185.09, 201
See application file for complete search history.

(56) References Cited

U.S. PATENT DOCUMENTS

| | | | |
|---|---|---|---|
| 6,370,668 B1 * | 4/2002 | Garrett et al. | 714/763 |
| 7,051,264 B2 * | 5/2006 | Leung et al. | 714/763 |
| 7,151,264 B2 * | 12/2006 | Ehlers, Sr. | 250/373 |
| 7,184,352 B2 * | 2/2007 | Klein et al. | 365/222 |
| 7,283,380 B1 * | 10/2007 | Srinivasan et al. | 365/49.17 |
| 7,340,668 B2 * | 3/2008 | Klein | 714/785 |
| 7,353,438 B2 * | 4/2008 | Leung et al. | 714/720 |
| 7,493,531 B2 * | 2/2009 | Ito et al. | 714/708 |
| 7,526,713 B2 * | 4/2009 | Klein | 714/763 |

FOREIGN PATENT DOCUMENTS

| | | |
|---|---|---|
| JP | 63-121933 A | 5/1988 |
| JP | 3-41537 A | 2/1991 |
| JP | 9-134314 A | 5/1997 |

OTHER PUBLICATIONS

H. Davis et al. "A 70-ns Word-Wide 1-Mbit ROM With On-Chip Error-Correction Circuits", IEEE J. Solid-State Circuits, vol. sc-20, No. 5, pp. 958-963, 1985.

* cited by examiner

*Primary Examiner*—Esaw T Abraham
(74) *Attorney, Agent, or Firm*—Miles & Stockbridge P.C

(57) ABSTRACT

There is provided a semiconductor device of which the circuit scale does not significantly increase even with an ECC function. A microcomputer having an internal flash memory inserts one weight in a sense amplifier activation signal only when an error detection signal is on the H level at a given time in a read cycle or when the error detection signal which was on the H level in a previous read cycle has shifted to the L level in a current read cycle. This allows the retrieval of output data signals after waiting till the output data signals through error correction are determined only when an error is contained in the output data signals.

16 Claims, 8 Drawing Sheets

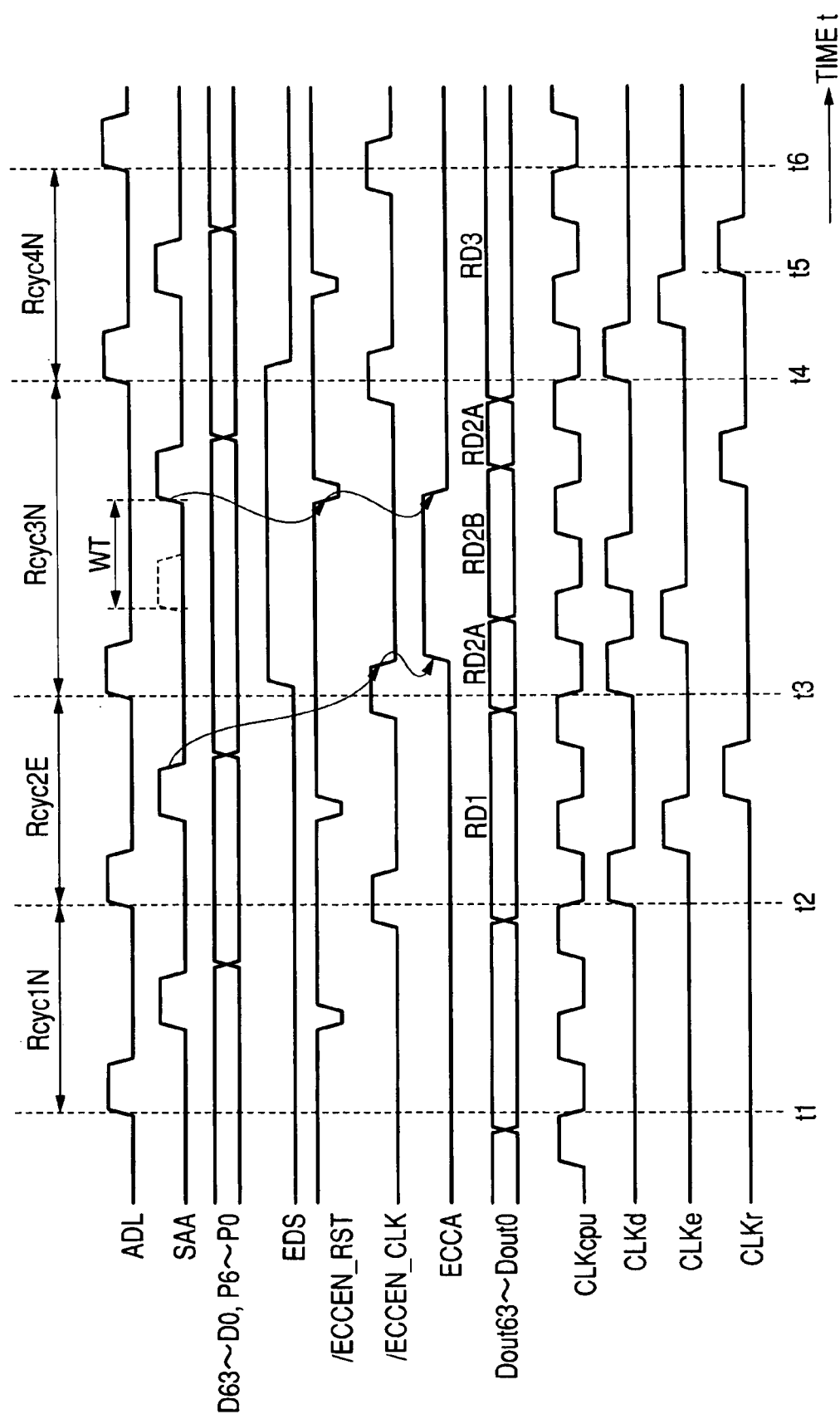

SEMICONDUCTOR MEMORY HAVING EMBEDDED MICROCOMPUTER WITH ECC FUNCTION

CROSS-REFERENCE TO RELATED APPLICATION

The present application claims priority from Japanese patent application No. 2006-62650 filed on Mar. 8, 2006, the content of which is hereby incorporated by reference into this application.

BACKGROUND OF THE INVENTION

The present invention relates to a semiconductor device and, more particularly, to a semiconductor device having an embedded microcomputer with an ECC (Error Checking and Correcting) function.

When data written in a semiconductor memory is erroneously read therefrom due to a software error or a retention failure, the correction of the erroneously read data using an ECC has been conventionally performed. An example of the application of the ECC to a semiconductor memory is disclosed in, e.g., H. Davis et al., "A 70-ns word-wide 1-Mbit ROM with on-chip error-correction circuits," IEEE J. Solid-State Circuits, vol. 20, pp. 958-963, 1985. As a method for outputting an error detection signal which is activated when read data contains an error, the following prior art technology has been used.

A conventional memory access controller comprises: a memory module for storing data and error detection/correction codes; an error detection/correction circuit for detecting/correcting an error in data read from the memory module; and a mechanism for retaining data corrected by the error detection/correction circuit. When an error is detected in the data read by the error detection/correction circuit during a process in a mode which transfers the read data directly to a processor, the memory access controller notifies the processor of the occurrence of the error and transfers corrected data retained therein to the processor (see, e.g., Japanese Unexamined Patent Publication No. Hei 9 (1997)-134314).

A conventional error detection/correction system comprises: syndrome generating means for generating an error syndrome based on data read from a data memory and on a check bit read from a check bit memory; error detecting means for detecting an error in the data read from the data memory based on the generated syndrome; error correcting means for correcting the error based on the syndrome temporality stored in a syndrome latch and on the data temporarily stored in a data latch; and means for giving an error detection output from the error detecting means as a retrial command signal for the reading of the data (see, e.g., Japanese Examined Patent Publication No. Hei 6 (1994)-70775).

A retry read control method used in a conventional memory device relates to a method for controlling a retry read access which is performed when an error is detected in data read from a main memory controlled by a main memory control unit. During a retry read access, the main memory control unit references an address buffer and issues a retry read access distinguished from a normal retry read access when the corresponding address is present in the address buffer. On recognizing the retry read access different from the normal retry read access, the main memory returns the read data corrected by a data buffer to the main memory control unit without activating a memory (see, e.g., Japanese Unexamined Patent Publication No. Hei 3 (1991)-41537).

SUMMARY OF THE INVENTION

Each of the prior art technologies disclosed in Japanese Unexamined Patent Publication No. Hei 9 (1997)-134314 and Japanese Unexamined Patent Publication No. Hei 3 (1991)-41537 has a structure in which a data latch for latching uncorrected data and a data latch for latching corrected data are separately provided to be switched by means of a selector depending on the result of an error detection. This leads to the problem that a circuit scale significantly increases particularly when a wide bus configuration is adopted.

In the prior art technology disclosed in Japanese Examined Patent Publication No. Hei 6 (1994)-70775, an output from a 3-state buffer for outputting corrected data from a latch and an output from a data memory are exclusively controlled so that two paths exist on a data bus. Consequently, there is the possibility that the circuit scale significantly increases due to dense and complicated wiring particularly when the wide bus configuration is adopted.

It is therefore an object of the present invention to provide a semiconductor device of which the circuit scale does not significantly increase even with an ECC function.

A semiconductor device according to the present invention comprises: a memory cell array for storing data signals and parity signals; sense amplifiers for reading the stored data signals and the stored parity signals; an error correction circuit for receiving the read data signals and the read parity signals and correcting an error contained in the data signals; and a memory module interface circuit for retrieving output data signals outputted from the error correction circuit and outputting the output data signals to a data bus. The error correction circuit includes: a syndrome generator portion for combining the read data signals and the read parity data signals with each other to generate syndrome signals; a decoder portion for specifying an error bit in the data signals from the syndrome signals; and an error corrector portion for correcting the error in the data signals based on output signals from the decoder portion. The memory module interface circuit includes: a data retrieval clock generator portion for generating a data buffer retrieval clock signal for giving a timing for retrieving the output data signals and an error detection signal determination clock signal for giving a timing for determining whether or not an error is contained in the data signals; and a data buffer for retrieving the output data signals in response to the data buffer retrieval clock signal. The semiconductor device further comprises: an error detector portion for detecting whether or not an error is contained in the data signals; and a sense amplifier activation signal generator portion for generating a sense amplifier activation signal for activating an operation of each of the sense amplifiers. When the error detection signal has been activated at a time at which the error detection signal determination clock signal shifts, each of the data buffer retrieval clock and the sense amplifier activation signal is delayed by a specified time.

In accordance with the present invention, the circuit scale does not significantly increase even with an ECC function.

BRIEF DESCRIPTION OF THE DRAWINGS

FIG. 8 is a waveform chart for illustrating the operation of the microcomputer 100B having an embedded flash memory of FIG. 7.

DETAILED DESCRIPTION OF THE PREFERRED EMBODIMENTS

Figure 1:
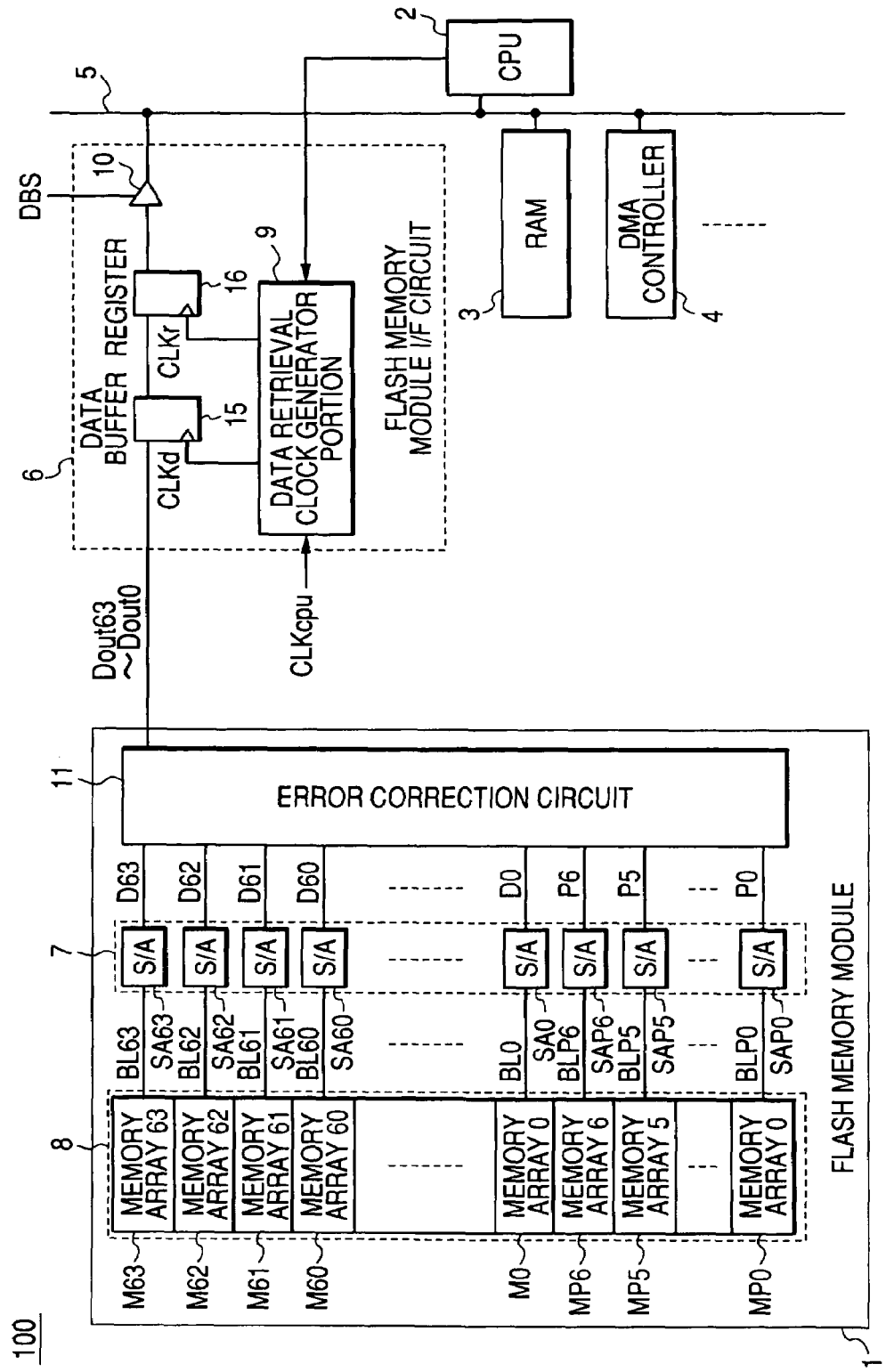
FIG. 1 is a schematic diagram showing a structure of a microcomputer 100 having an embedded flash memory as a background for describing the embodiments of the present invention.

The embodiments of the present invention will be described herein below in detail with reference to the drawings. The same or corresponding parts in the drawings are designated by the same reference numerals and the description thereof will not be repeated.

FIG. 1 is a schematic diagram showing a structure of a microcomputer 100 having an embedded flash memory as a background for describing the embodiments of the present invention.

Referring to FIG. 1, the microcomputer 100 having an embedded flash memory comprises: a flash memory module 1; a CPU (Central Processing Unit) 2; a RAM (Random Access Memory) 3; a DMA (Direct Memory Access) controller 4; a data bus 5; and a flash memory module I/F (Interface) circuit 6. The flash memory module 1 is connected to a data bus 5 via the flash memory module I/F circuit 6. The flash memory module 1 shares the data bus 5 with each of the CPU 2, the RAM 3, the DMA controller 4, and the like.

The flash memory module 1 includes a set of sense amplifiers (S/A) 7, a memory cell array 8, and an error correction circuit 11. The set of sense amplifiers 7 include sense amplifiers SA0 to SA63 for reading data signals and sense amplifiers SAP0 to SAP6 for reading parity signals. The memory cell array 8 includes memory arrays M0 to M63 for storing the data signals and memory arrays MP0 to MP6 for storing the parity signals.

The sense amplifiers SA0 to SA63 are connected to the respective memory arrays M0 to M63 via bit lines BL0 to BL63. The sense amplifiers SA0 to SA63 output respective data signals D0 to D63 to the error correction circuit 11. The sense amplifiers SAP0 to SAP6 are connected to the respective memory arrays MP0 to MP6 via bit lines BLP0 to BLP6. The sense amplifiers SAP0 to SAP6 output respective parity signals P0 to P6 to the error correction circuit 11. The error correction circuit 11 receives the data signals D0 to D63 and the parity signals P0 to P6 and output data signals Dout0 to Dout63 obtained by correcting an error contained in the data signals D0 to D63 to the flash memory module I/F circuit 6.

The flash memory module I/F circuit 6 includes a data retrieval clock generator portion 9, a data bus driver 10, a data buffer 15, and a register 16. The data buffer 15 temporarily retains the output data signals Dout0 to Dout63 in synchronization with a data buffer retrieval clock CLKd. The register 16 temporarily retains output signals from the data buffer 15 in synchronization with a register retrieval clock CLKr outputted from the data retrieval clock generator portion 9.

The data retrieval clock generator portion 9 generates the data buffer retrieval clock CLKd and the register retrieval clock CLKr based on a CPU clock CLKcpu for controlling the CPU 2. The data bus driver 10 receives output signals from the register 16 and also drives the data bus 5 in response to a data bus driver activation signal DBS.

A description will be given to a path for reading data and the like from the flash memory module 1.

The set of sense amplifiers 7 read data from the memory cell array 8. During the reading of data and the like, one memory cell is selected via a word line and a column selection line which are not shown in accordance with an address signal inputted to the flash memory module 1. The selected memory cell is connected to the set of sense amplifiers 7 via the corresponding bit line.

Figure 2:
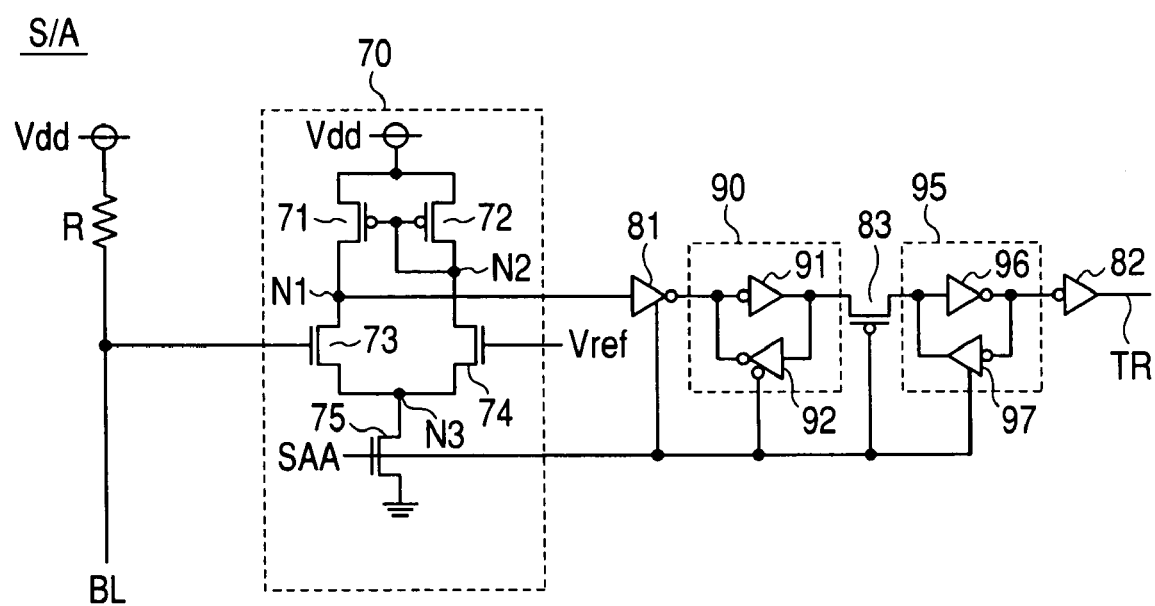
FIG. 2 is a circuit diagram showing an example of a structure of a sense amplifier S/A in the set of sense amplifiers 7 of FIG. 1.

FIG. 2 is a circuit diagram showing an example of a structure of a sense amplifier S/A in the set of sense amplifiers 7 of FIG. 1.

Referring to FIG. 2, the sense amplifier S/A includes a current-mirror sense amplifier portion 70, inverters 81 and 82, a P-channel MOS transistor 83, and latch circuits 90 and 95. The sense amplifier portion 70 includes P-channel MOS transistors 71 and 72 and N-channel MOS transistors 73, 74, and 75. The latch circuit 90 includes inverters 91 and 92 which are connected with each other in a cyclic configuration. The latch circuit 95 includes inverters 96 and 97 which are connected with each other in a cyclic configuration.

The P-channel MOS transistor 71 is connected between a power source node for giving a power source voltage Vdd and a node N1, while having a gate connected to a node N2. The P-channel MOS transistor 72 is connected between the power source node and the node N2, while having a gate connected to the node N2. The N-channel MOS transistor 73 is connected between the nodes N1 and N3, while having a gate connected to a bit line BL. The bit line BL is connected to the power source node via a resistor with a resistance value R. The N-channel MOS transistor 74 is connected between the node N2 and a node N3, while having a gate to which a reference voltage Vref is applied.

The N-channel MOS transistor 75 is connected between the node N3 and the ground node, while having a gate receiving a sense amplifier activation signal SAA. The sense amplifier activation signal SAA is a signal for activating or inactivating the operation of the sense amplifier S/A and is also supplied to each of the inverters 81, 92, and 97 and the P-channel MOS transistor 83. The inverter 81 is connected between the node N1 and the latch circuit 90. The P-channel MOS transistor 83 is connected between the latch circuits 90 and 95. The inverter 82 is connected between the latch circuit 95 and an output terminal TR.

A description will be given to the operation of the sense amplifier S/A.

In the flash memory, whether information stored in a selected one of the memory cells is 1 or 0 is determined based on whether a current allowed to flow through the memory cell is larger or smaller in amount than a specified value. In the circuit structure of the sense amplifier S/A shown in FIG. 2, when the amount of the current is smaller than (Vdd−Vref)/R during the period during which the sense amplifier activation signal SAA is on the H level (logic high), the information is determined to be 0. Conversely, when the amount of the current is larger than (Vdd−Vref)/R during that period, the information is determined to be 1. On receiving the result of the determination, the corresponding data on the H level or the L level (logic low) is outputted from the output terminal RT of the sense amplifier S/A. At the time at which the sense amplifier activation signal SAA shifts to the L level, the sense amplifier S/A retains the output data at the time in the latch circuit 95.

The signals outputted from the set of sense amplifiers 7 are inputted to the error correction circuit 11 for detecting/correcting an error in data by using an ECC. The ECC is a technology which adds N-bit parity signals to M-bit data signals and correcting, when (M+N)-bit signals contains an error bit with inverted data, the error bit. Specifically, when 1-bit error correction is performed with respect to the M-bit data signals, it is necessary to add the N-bit parity signals consisting of the number of bits which satisfies the relationship given by the following numerical expression:

$$2^M = M + N + 1.$$

By way of example, a description will be given to the operation of the error correction circuit which performs 1-bit error correction with respect to signals consisting of the total of 7 bits as a result of adding the 3-bit parity signals P2 to P0 to the 4-bit data signals D3 to D0. It is determined herein that, in order to satisfy the relationships given by the following numerical expressions (21) to (23):

$$D0 \text{ xor } D2 \text{ xor } P0 \text{ xor } P2 = 0 \quad (21)$$

$$D1 \text{ xor } D2 \text{ xor } P1 \text{ xor } P2 = 0 \quad (22)$$

$$D3 \text{ xor } P0 \text{ xor } P1 \text{ xor } P2 = 0 \quad (23),$$

the parity signals P2 to P0 are given by the following numerical expressions (31) to (33):

$$P2 = D0 \text{ xor } D2 \text{ xor } D3 \quad (31)$$

$$P1 = D0 \text{ xor } D1 \text{ xor } D3 \quad (32)$$

$$P0 = D1 \text{ xor } D2 \text{ xor } D3 \quad (33).$$

wherein xor represents a logical exclusive OR. When data is written at arbitrary addresses in a semiconductor memory, the parity signals P2 to P0 are generated from the data signals D3 to D0 in accordance with the numerical expressions (31) to (33) and parity bits are written in a parity bit space at the addresses. A description will be given to the case where, when the written signals are read, the erroneous data is read due to, e.g., the inversion of the data signal D2 and inputted to the error correction circuit 11 with reference to the following drawing.

Figure 3:
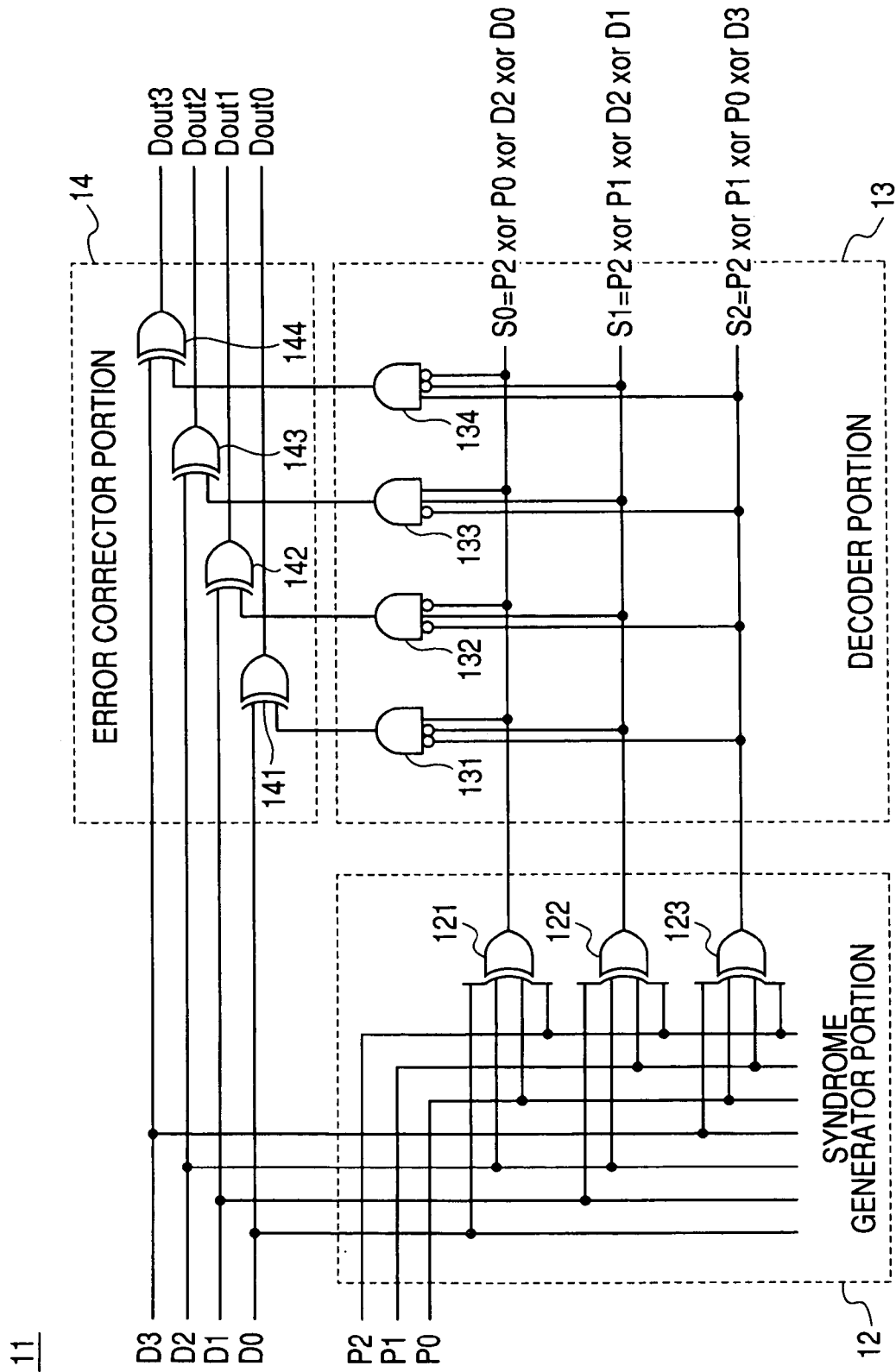
FIG. 3 is a circuit diagram showing an example of a specific structure of the error correction circuit 11 of FIG. 1.

FIG. 3 is a circuit diagram showing an example of a specific structure of the error correction circuit of FIG. 1

Referring to FIG. 3, the error correction circuit 11 includes a syndrome generator portion 12 for generating syndromes, a decoder portion 13 for specifying an error bit from the syndromes, and an error corrector portion 14 for performing correction by inverting the error bit.

The syndrome generator portion 12 includes XOR circuits 121 to 123. The XOR circuits 121 to 123 generate syndromes S0 to S2 such that the following numerical expressions (41) to (43) are satisfied therewith:

$$S0 = P2 \text{ xor } P0 \text{ xor } D2 \text{ xor } D0 \quad (41)$$

$$S1 = P2 \text{ xor } P1 \text{ xor } D2 \text{ xor } D1 \quad (42)$$

$$S2 = P2 \text{ xor } P1 \text{ xor } P0 \text{ xor } D3 \quad (43).$$

If all the data signals D0 to D3 and all the parity signals P0 to P2 have been read with no error, it follows that each of the syndromes S0 to S2 becomes 0 in accordance with the numerical expressions (41) to (43). However, when the data signal D2 is erroneously inverted and read, the syndromes S0 to S2 satisfy S0=1, S1=1, and S2=0. The decoder portion 13 specifies the error bit based on the syndromes S0 to S2 shown above.

The decoder portion 13 includes AND circuits 131 to 134. The AND circuit 131 outputs a logical AND between the syndrome S0 and the inverted signals of the syndromes S1 and S2. The AND circuit 132 outputs a logical AND between the syndrome S1 and the inverted signals of the syndromes S0 and S2. The AND circuit 133 outputs a logical AND between the syndromes S0 and S1 and the inverted signal of the syndrome S2. The AND circuit 134 outputs a logical AND between the syndrome S2 and the inverted signals of the syndromes S0 and S1.

With the structures of the AND circuits 131 to 134, when the data signal D2 is erroneously inverted and read, only the AND circuit 132 outputs "1" and each of the AND circuits 131, 133, and 134 outputs "0". Based on the results, the error corrector portion 14 performs error correction by inverting the data signal D2.

The error corrector portion 14 includes XOR circuits 141 to 144. The XOR circuit 141 outputs the output data signal Dout0 which is a logical exclusive OR between the data signal D0 and an output signal from the AND circuit 131. The XOR circuit 142 outputs the output data signal Dout1 which is a logical exclusive OR between the data signal D1 and an output signal from the AND circuit 132. The XOR circuit 143 outputs the output data signal Dout2 which is a logical exclusive OR between the data signal D2 and an output signal from the AND circuit 133. The XOR circuit 144 outputs the output data signal Dout3 which is a logical exclusive OR between the data signal D3 and an output signal from the AND circuit 134.

In this manner, the error correction circuit 11 outputs the output data signals Dout0 to Dout3 through error correction. By mounting an error correction circuit using an ECC as described above on a semiconductor memory, it becomes possible to correct an error in data due to a software error or a retention failure so that the reliability of the semiconductor memory is improved.

Referring again to FIG. 1, the flash memory module I/F circuit 6 receives the output data signals Dout0 to Dout63. The output data signals Dout0 to Dout63 are outputted to the data bus 5 through the data buffer 15, the register 16, and the like. A description will be given to the operation of the microcomputer 100 having an embedded flash memory with reference to the following drawing.

Figure 4:
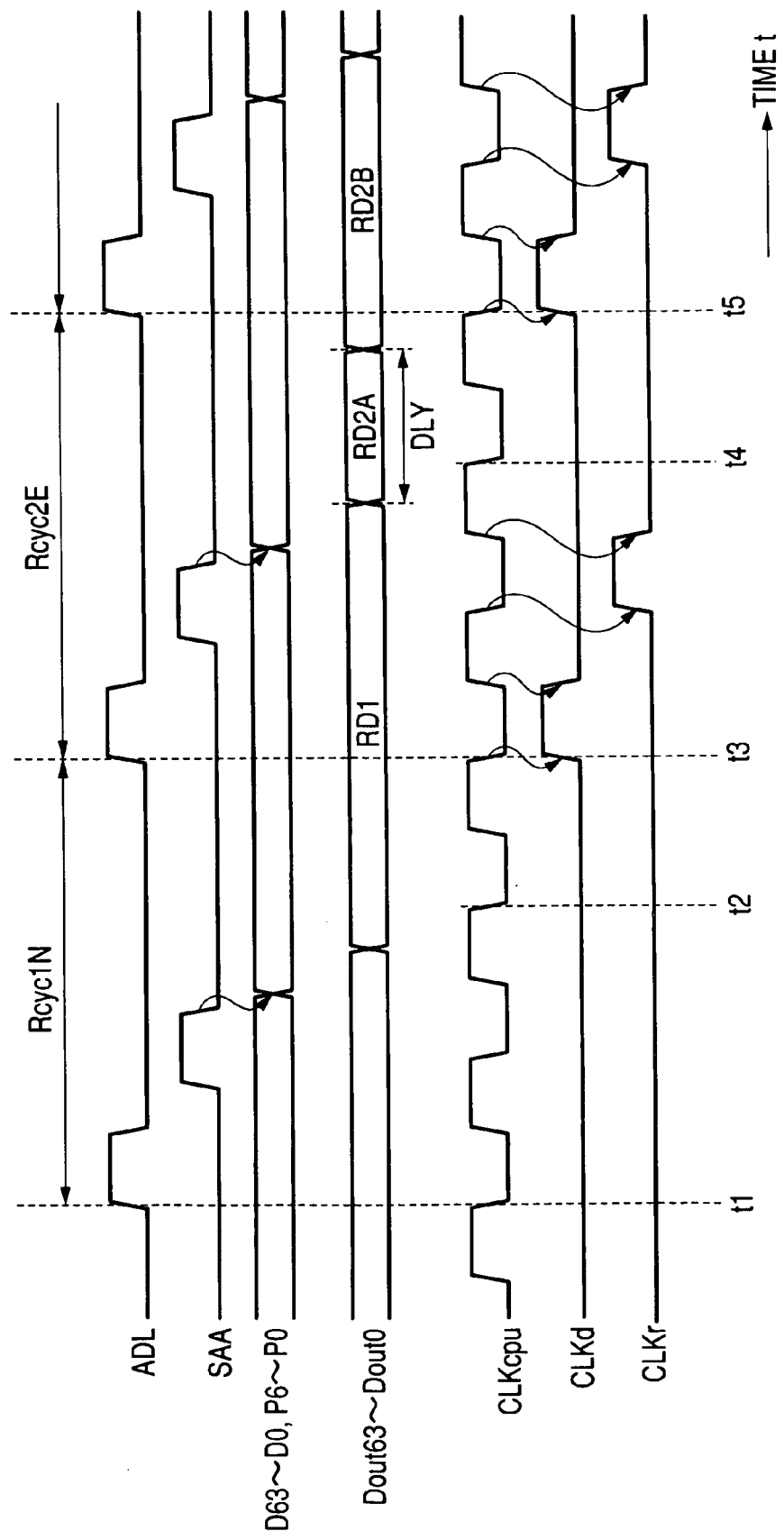
FIG. 4 is a waveform chart for illustrating the operation of the microcomputer 100 having an embedded flash memory of FIG. 1.

FIG. 4 is a waveform chart for illustrating the operation of the microcomputer 100 having an embedded flash memory of FIG. 1.

Referring to FIG. 4, an address latch signal ADL rises at each of the times t1, t3, t5. It is assumed that data read in the read cycle Rcyc1N (times t1 to t3) contains no error and data read in the read cycle Rcyc2E (times t3 to t5) contains an error.

In either of the read cycles Rcyc1N and Rcyc2E, the set of sense amplifiers 7 generate the data signals D63 to D0 and the parity signals P6 to P0 in response to the rising/falling edge of the sense amplifier activation signal SAA. Thereafter, the output data signals Dout63 to Dout0 in which the error contained in data has been corrected are outputted from the error corrector portion 14 of the error correction circuit 11.

Since the data (RD2A) read in the read cycle Rcyc2E contains the error, an extra delay DLY resulting from error correction occurs when the output data signals Dout63 to Dout0 are determined. As a result, the data (RD2B) cannot be retrieved in synchronization with the data buffer retrieval clock CLKd without waiting till the time t5 after the time t4.

Since the data (RD1) read in the read cycle Rcyc1N contains no error, the output data signals Dout63 to Dout0 have been already determined at the time t2. However, since it is not clear whether the output data signals Dout63 to Dout0 are correct or false at the time t2, in case the output data signals Dout63 to Dout0 are false, it is necessary to eventually retrieve the data (RD1) after waiting till the time T3 in consideration of the delay DLY.

Thus, in the microcomputer 100 having an embedded flash memory of FIG. 1, the error correction circuit 11 has been inserted in an access path for reading data from the memory cells. The microcomputer 100 having an embedded flash memory outputs the data signals D63 to D0 and the parity signals P6 to P0 read by the set of sense amplifiers 7 to the error correction circuit 11. The error correction circuit 11 successively performs the generation of syndromes, the specification of an error bit, and the correction of the error bit.

Because of the structure described above, it is not clear in the microcomputer 100 having an embedded flash memory whether a data input prior to error correction is false or correct during the period from the shifting of the data input till correction is performed. This causes the need to retrieve the determined output data signals after waiting in consideration of the time period from the shifting of the data input to the error correction circuit 11 till error correction is performed. As a result, it has been common practice to add the extra delay in the error correction circuit 11 to an address access in the memory irrespective of whether or not data is actually erroneous.

In an on-chip memory, in particular, the width of the data bus 5 is set large for an increase in the rate of data transfer. In that case, each of the XOR circuits of the syndrome generator portion 12 in the error correction circuit 11 has multiple inputs and the number of bits of syndromes also increases. As a result, each of the AND circuits of the decoder portion 13 also has a larger number of inputs so that the delay in the error correction circuit 11 is further increased.

In recent years, the operating frequency of a semiconductor chip has improved. In view of this, it can be said that the performance of a system including the semiconductor chip is greatly affected by a situation where the address access should be defined by constantly considering the delay in the error correction circuit 11 irrespective of whether or not data is actually erroneous.

In the following embodiments, a detailed description will be given to the structure and operation of a microcomputer having an embedded flash memory which attains the above-mentioned object of the present invention and eliminates the need to constantly consider a delay in an error correction circuit in defining an address access.

Embodiment 1

Figure 5:
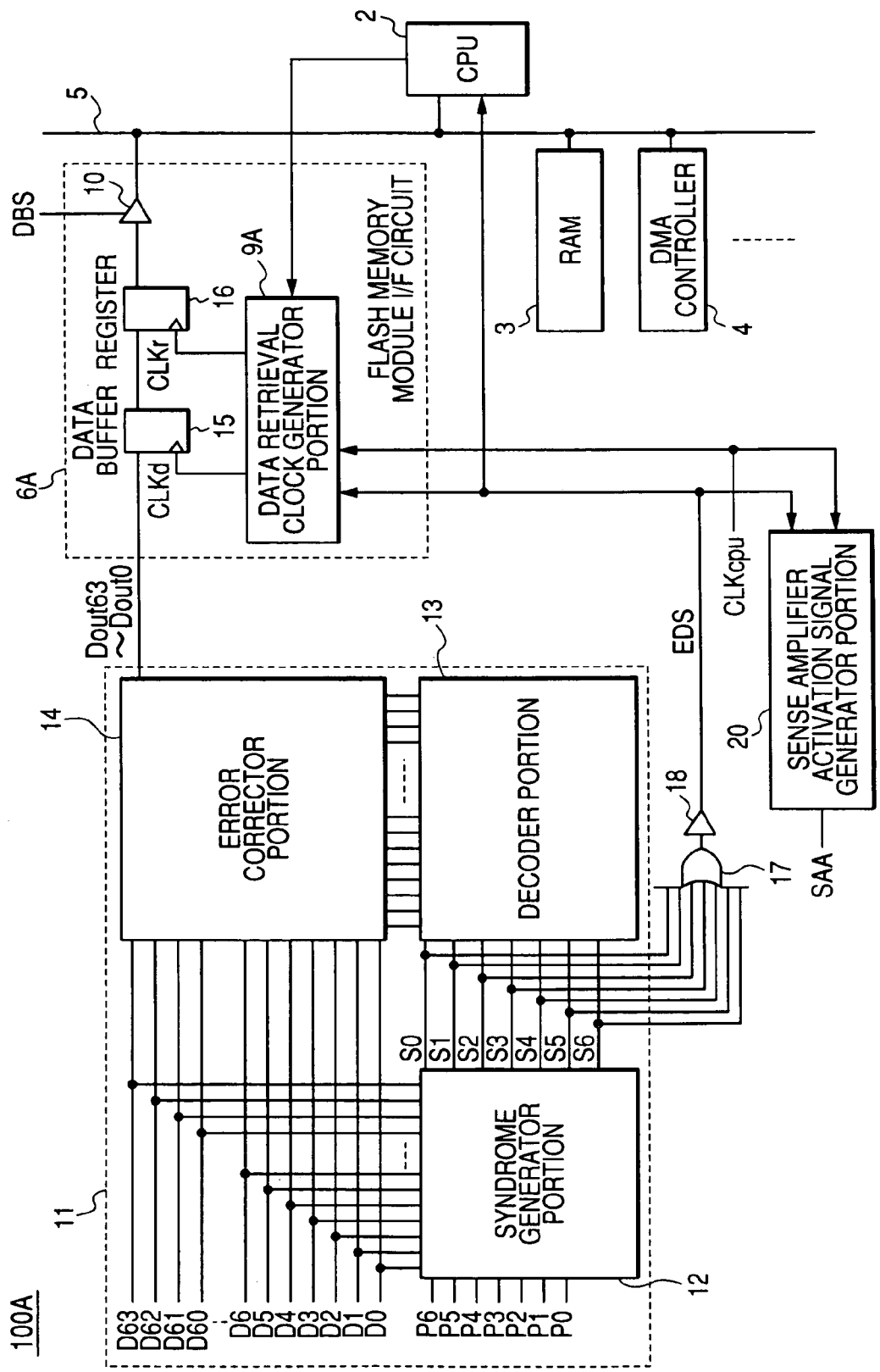
FIG. 5 is a schematic diagram showing a structure of a microcomputer 100A having an embedded flash memory according to the first embodiment of the present invention.

FIG. 5 is a schematic diagram showing a structure of a microcomputer 100A having an embedded flash memory according to the first embodiment of the present invention.

Referring to FIG. 5, the microcomputer 100A having an embedded flash memory according to the first embodiment is different from the microcomputer 100 having an embedded flash memory of FIG. 1 in that a logical OR stage 17, a buffer stage 18, and a sense amplifier activation signal generator portion 20 have been added thereto and that a flash memory module I/F circuit 6A is provided as a replacement for the flash memory module I/F circuit 6. Accordingly, the description of the parts common to FIG. 1 will not be repeated herein.

The flash memory module I/F circuit 6A is different from the flash memory module I/F circuit 6 in that a data retrieval clock generator portion 9A is provided as a replacement for the data retrieval clock generator portion 9. The data retrieval clock generator portion 9A receives an error detection signal EDS for detecting whether or not an error is contained in the data signals D0 to D63.

In the microcomputer 100A having an embedded flash memory of FIG. 5, only the error correction circuit 11 of the components of the flash memory module 1 is depicted. It is assumed that the error correction circuit 11 includes the syndrome generator portion 12, the decoder portion 13, and the error corrector portion 14 and performs 1-bit error correction with respect to the 64-bit data signals D0 to D63. At this time, the 7-bit parity signals P0 to P6 are needed in accordance with the numerical expression (11).

The logical OR stage 17 performs a logical OR operation with respect to the syndromes S0 to S6 outputted from the syndrome generator portion 12 and thereby generates the error detection signal EDS. The error detection signal EDS shifts to the H level when at least one error is contained in the data signals D0 to D63 inputted to the syndrome generator portion 12 and shifts to the L level when no error is contained therein. The buffer stage 18 buffers the error detection signal EDS and outputs the buffered error detection signal EDS to the data retrieval clock generator portion 9A, to the sense amplifier activation signal generator portion 20, and to the CPU 2.

The determination of the error detection signal EDS is earlier than the determination of the error-corrected output data signals Dout0 to Dout63 in the error correction circuit 11. This is because the error-corrected output data signals are determined after the syndromes S0 to S6 pass through the decoder portion 13 and an error bit is specified, while the error detection signal EDD is determined after the syndromes S0 to S6 pass through only the logical OR stage 17 and the buffer stage 18. The number of the AND circuits in the decoder portion 13 is larger than the total number of the logical OR stage 17 and the buffer stage 18.

Thus, according to the microcomputer 100A having an embedded flash memory according to the first embodiment, it is possible to know in advance whether or not error correction is to be performed before the error-corrected output data signals are determined by referencing the logic value of the error detection signal EDS.

Specifically, the microcomputer 100A having an embedded flash memory inserts one weight WT in the sense amplifier activation signal SAA only when the error detection signal EDS is on the H level at a given time in a read cycle or when the error detection signal EDS which was on the H level in the previous read cycle has shifted to the L level in the current read cycle. As a result, only when an error is contained in the output data signals, the output data signals can be retrieved after waiting till the error-corrected data signals are determined.

The data retrieval clock generator portion 9A adjusts the timing for generating the data buffer retrieval clock CLKd and the timing for generating the register retrieval clock CLKr based on the CPU clock CLKcpu and on the error detection signal EDS. The sense amplifier activation signal generator portion 20 adjusts the timing for generating the sense amplifier activation signal SAA based on the CPU clock CLKcpu and on the error detection signal EDS.

The microcomputer 100 having an embedded flash memory of FIG. 1 has delayed the retrieval of the data in consideration of the delay resulting from error correction irrespective of whether or not error correction is actually performed by using the ECC. By contrast, the microcomputer 100A having an embedded flash memory according to the first embodiment can suppress the lowering of the rate of data transfer because it retrieves the data by inserting the weight WT only when an error is present in the read data. A description will be given to the operation of the microcomputer 100A having an embedded flash memory described above with reference to the following drawing.

Figure 6:
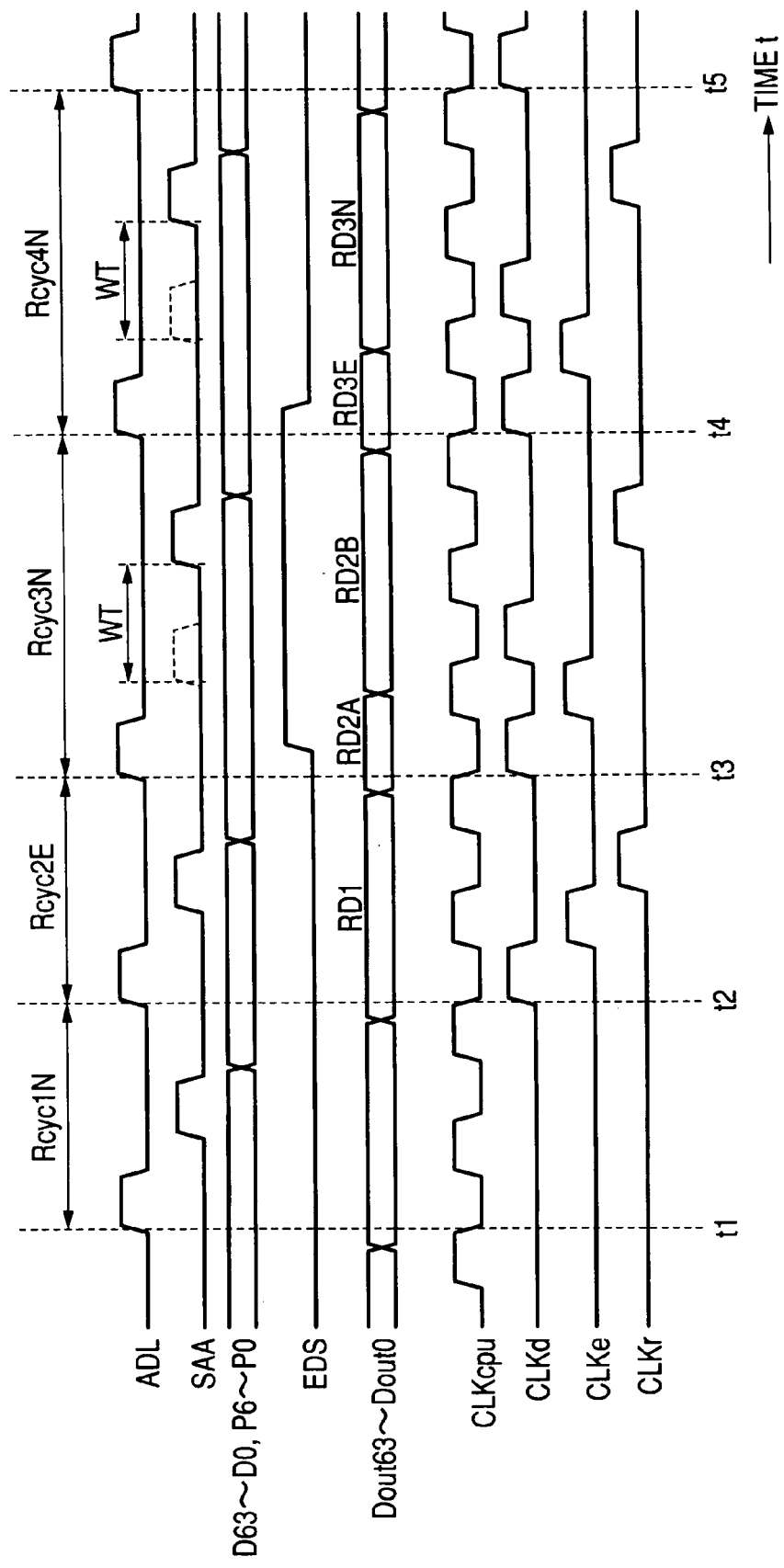
FIG. 6 is a waveform chart for illustrating the operation of the microcomputer 100A having an embedded flash memory of FIG. 5.

FIG. 6 is a waveform chart for illustrating the operation of the microcomputer 100A having an embedded flash memory of FIG. 5.

Referring to FIG. 6, the address latch signal ADL rises at each of the times t1 to t5. It is assumed that data read in the read cycles Rcyc1N (times t1 and t2), Rcyc3N (t3 and t4), and Rcyc4N (t4 and t5) contains no data, while data read in the read cycle Rcyc2E (times t2 and t3) contains an error.

In any of the read cycles Rcyc1N to Rcyc4N, the set of sense amplifiers 7 generate the data signals D63 to D0 and the parity signals P6 to P0 in response to the rising/falling edge of the sense amplifier activation signal SAA. Thereafter, the output data signals Dout63 to Dout0 in which the error contained in data has been corrected are outputted from the error corrector portion 14 of the error correction circuit 11.

(1) Read Cycles Rcyc1N and Rcyc2E

In the read cycle Rcyc1N, data (RD1) with no error is read. In this case, the data retrieval clock generator portion 9A generates the rising edge of the data buffer retrieval clock CLKd at the time t2 in synchronization with the falling edge of the CPU clock CLKcpu. In response to this, the data buffer 15 retrieves the data (RD1) from the error corrector portion 14 of the error correction circuit 11.

The data retrieval clock generator portion 9A generates the rising edge of an error detection signal determination clock CLKe in synchronization with the rising edge of the CPU clock CLKcpu subsequent to the rising edge of the data buffer retrieval clock CLKd. Since the error detection signal EDS is on the L level on the rising edge of the error detection signal determination clock CLKe, the data retrieval clock generator portion 9A continues to generate the rising edge of the register retrieval clock CLKr in synchronization with the falling edge of the CPU clock CLKcpu.

In response to the rising edge of the register retrieval clock CLKr, the register 16 retrieves an output signal from the data buffer 15. Thus, in the read cycle Rcyc1N in which read data contains no data, a delay caused by bypassing the error correction circuit 11 corresponds to only a gate delay in the error corrector portion 14 so that an access time is equal to that in the case where no error correction is performed with respect to the data signals.

(2) Read Cycles Rcyc2E and Rcyc3N

In the read cycle Rcyc2E, data (RD2A) with an error is read. In this case also, the data buffer 15 retrieves the output data signals Dout63 to Dout0 from the error correction circuit 11 in response to the rising edge of the data buffer retrieval clock CLKd at the time t3 in the same manner as in the read cycles Rcyc1N and Rcyc2E described above. At this time, however, the output data signals Dout63 to Dout0 contain an error since they represent the data (RD2A) prior to error correction.

The data retrieval clock generator portion 9A generates the rising edge of the error detection signal determination clock CLKe in synchronization with the rising edge of the CPU clock CLKcpu subsequent to the rising edge of the data buffer retrieval clock CLKd described above. Since the error detection signal EDS is on the H level on the rising edge of the error detection signal determination clock CLKe, it can be seen at this time that the output data signals Dout63 to Dout0 retrieved into the data buffer 15 are erroneous.

As a result, the data retrieval clock generator portion 9A re-generates the rising edge of the data buffer retrieval clock CLKd in synchronization with the next falling edge of the CPU clock CLKcpu. In response to the re-generated rising edge of the data buffer retrieval clock CLKd, the data buffer 15 retrieves the data (RD2B) after error correction again from the error corrector portion 14 of the error correction circuit 11. Consequently, the generation of the subsequent register retrieval clocks CLKr are delayed in succession.

In the description given above, when the sense amplifier activation signal SAA is activated in the read cycle Rcyc3N while the data (RD2B) after error correction is retrieved from the error corrector portion 14 into the data buffer 15, the values of the output data signals change and the output data signals in the read cycle Rcyc2E cannot be retrieved any more. To prevent this, the sense amplifier activation signal generator portion 20 inserts the weight WT corresponding to one cycle of the CPU clock CLKcpu when the sense amplifier activation signal SAA is generated. In this manner, measures are taken not to prevent the output data signals from being retrieved again in the read cycle Rcyc2E.

(3) Read Cycles Rcyc3N and Rcyc4N

In the read cycles Rcyc3N and Rcyc4N, the data signals with no error are read again. In this case, the operation of the microcomputer 100A having an embedded flash memory is basically the same as in the read cycle Rcyc1N. However, in the read cycle Rcyc3N, the influence of the error which was present in the read cycle Rcyc2E remains, though the data read in the read cycle Rcyc3N contains no error. A description will be given to the operation of the microcomputer 100A having an embedded flash memory, which is for the avoidance of the influence.

At the time t4, the data retrieval clock generator portion 9A generates the rising edge of the data buffer retrieval clock CLKd in synchronization with the falling edge of the CPU clock CLKcpu. In response to this, the data buffer attempts to newly retrieve the output data signals Dout63 to Dout0 with no error instead of the data (RD2B) corrected by inverting the error bit during the reading of the data in the read cycle Rcyc2E.

At this time, however, the signal specifying the error bit in the read cycle Rcyc2E has been outputted from the decoder portion 13 so that the output data signals retrieved into the data buffer 15 are those for error-corrected data (RD3E). Thereafter, when the error detection signal EDS shifts from the H level to the L level and the signal specifying the error bit in the read cycle Rcyc2E is no more outputted from the decoder portion 13, the error-corrected data (RD3E) shifts to data (RD3N) with no error.

As a result, the data retrieval clock generator portion 9A re-generates the rising edge of the data buffer retrieval clock CLKd such that the data (RD3N) with no error is finally retrieved. In response to the re-generated rising edge of the data buffer retrieval clock CLKd, the data buffer 15 retrieves the data (RD3N) with no error again from the error corrector portion 14 of the error correction circuit 11.

In the description given above, when the sense amplifier activation signal SAA is activated in the read cycle Rcyc4N while the data (RD3N) with no data is retrieved from the error corrector portion 14 into the data buffer 15, the values of the output data signals change and the output data signals in the read cycle Rcyc3N cannot be retrieved any more. To prevent this, the sense amplifier activation signal generator portion 20 inserts the weight WT corresponding to one cycle of the CPU clock CLKcpu1 when the sense amplifier activation signal SAA is generated in the same manner as in the read cycle Rcyc3N.

Thus, the microcomputer 100A having an embedded flash memory according to the first embodiment retrieves data in the three cycles including the time of error detection only in the following first or second case. The first case is a case where the error detection signal EDS is on the H level on the rising edge of the error detection signal determination clock CLKe in any of the read cycles. The second case is a case where the error detection signal EDS shifts from the H level to the L level on the rising edge of the error detection signal determination clock CLKe in each of the previous read cycle and the current read cycle.

In the first or second case, the microcomputer 100A having an embedded flash memory causes the data retrieval clock generator portion 9 to generate the rising edge of the data buffer retrieval clock CLKd again, while inserting the weight WT corresponding to one cycle of the CPU clock CLKcpu when the sense amplifier activation signal SAA is generated in the sense amplifier activation signal generator portion 20.

That is, the microcomputer having an embedded flash memory according to the first embodiment is a SoC (System on a Chip) having an embedded semiconductor memory with an error correction circuit using an ECC and a circuit for outputting an error detection signal which is activated when read data contains an error is provided therein. The SoC is constituted to insert a weight when the error in data is detected or when the error detection signal EDS shifts to the L level and thereby retrieve data again.

Specifically, the microcomputer 100A having an embedded flash memory delays the data buffer retrieval clock CLKd and the sense amplifier activation signal SAA by a specified time when the error detection signal EDS has been activated at the time at which the error detection signal determination clock CLKe shifts or when the error detection signal EDS shifts from the H level to the L level at the time at which the error detection signal determination clock CLKe shifts between the previous read cycle and the current read cycle.

The microcomputer 100 having an embedded flash memory of FIG. 1 has delayed the retrieval of data into the data buffer 15 in each of the read cycles in consideration of the delay time required for error correction irrespective of whether or not an error has occurred. By contrast, in the microcomputer 100A having an embedded flash memory according to the first embodiment, the degradation of system performance due to ECC correction can be suppressed because, as the frequency with which error correction using the ECC occurs is lower, the frequency with which the weight WT is inserted is accordingly lower.

In addition, the microcomputer 100A having an embedded flash memory according to the first embodiment is also advantageous in terms of the area occupied by the circuits because only one pair of the data latches are provided and there is no portion where a bus for corrected data and a bus for uncorrected data extend in parallel.

Embodiment 2

The microcomputer 100A having an embedded flash memory according to the first embodiment has inserted one weight WT during the retrieval of data provided that data read in the previous read cycle contains an error, even though data read in the current read cycle contains no error. Accordingly, even when the read cycle in which erroneous data has been read is only one, it has been necessary to perform the insertion of the weight WT over the two read cycles.

By contrast, a microcomputer 100B having an embedded flash memory according to the second embodiment of the present invention has a structure in which, only when read data contains an error, the weight WT is inserted during the retrieval of the erroneous data, as will be described herein below. This allows further suppression of the lowering of the data transfer rate due to an error in data than in the microcomputer 100A having an embedded flash memory according to the first embodiment.

Figure 7:
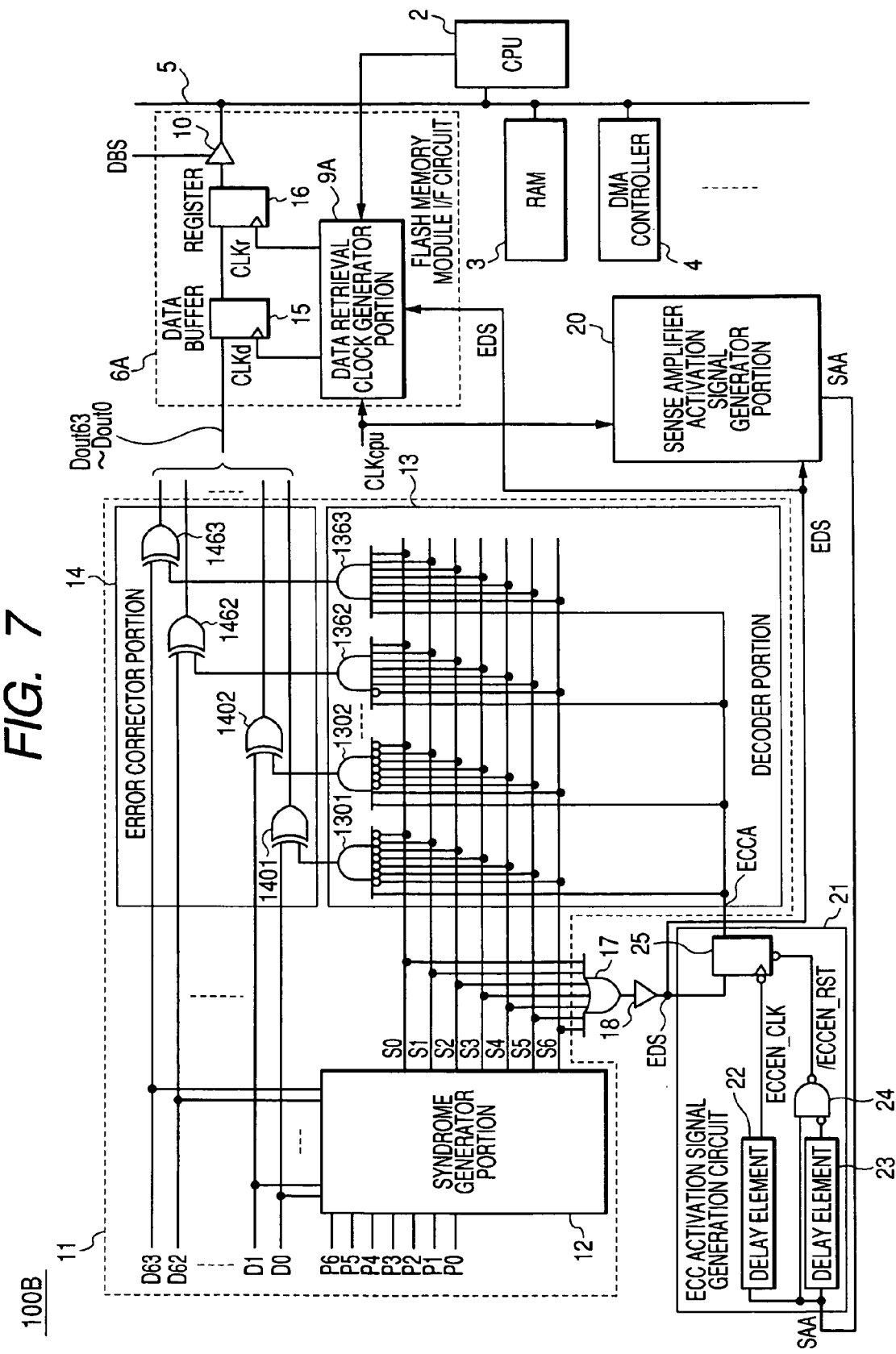
FIG. 7 is a schematic diagram showing a structure of a microcomputer 100B having an embedded flash memory according to the second embodiment of the present invention.

FIG. 7 is a schematic diagram showing the structure of the microcomputer 100B having an embedded flash memory according to the second embodiment.

Referring to FIG. 7, the microcomputer 100B having an embedded flash memory according to the second embodiment has the structure different from that of the microcomputer 100A having an embedded flash memory according to the first embodiment in that an ECC activation signal generation circuit 21 has been added thereto. Therefore, the description of the parts common to FIG. 1 will not be repeated herein.

In the microcomputer 100B having an embedded flash memory of FIG. 7, only the error correction circuit 11 of the components of the flash memory module 1 is depicted, in the same manner as in the first embodiment. It is assumed that the error correction circuit 11 includes: the syndrome generator portion 12, the decoder portion 13, and the error corrector portion 14 and performs 1-bit error correction with respect to the 64-bit data signals D0 to D63 in the same manner as in the first embodiment. At this time, the 7-bit parity signals P0 to P6 are needed in accordance with the numerical expression (11).

The logical OR stage 17 generates the error detection signal EDS by performing a logical OR operation with respect to the syndromes S0 to S6 outputted from the syndrome generator portion 12. The error detection signal EDS shifts to the H level when at least one error is contained in the data signals D0 to D63 inputted to the syndrome generator portion 12 and shifts to the L level when no error is contained therein. The buffer stage 18 buffers the error detection signal EDS and outputs the buffered error detection signal EDS to the ECC activation signal generation circuit 21.

The ECC activation signal generation circuit 21 includes delay elements 22 and 23, a NAND circuit 24, and a flip-flop circuit 25. The NAND circuit 24 receives the sense amplifier activation signal SAA and the inverted signal of the sense amplifier activation signal SAA that has passed through the delay element 23 and outputs an ECC reset signal /ECCEN_RST for the flip-flop 25. The sense amplifier activation signal SAA is generated by the sense amplifier activation signal generator portion 20 shown in FIG. 5 according to the first embodiment.

The flip-flop circuit 25 receives the error detection signal EDS and outputs the ECC circuit activation signal ECCA to the decoder portion 13, each in synchronization with an ECC clock signal ECCEN_CLK. The ECC clock signal ECCEN_CLK is obtained by delaying the sense amplifier activation signal SAA by means of the delay element 22.

The decoder portion 13 includes AND circuits 1301 to 1363. The AND circuits 1301 to 1363 output the logical ANDs between the syndromes S0 to S6 or the inverted signal thereof and the ECC circuit activation signal ECCA. The error corrector portion 14 includes XOR circuits 1401 to 1463. The XOR circuits 1401 to 1463 output the output data signals Dout0 to Dout63 which are the logical exclusive ORs between the data signals D0 to D63 and output signals from the AND circuits 1301 to 1363.

As described above, the microcomputer 100B having an embedded flash memory according to the second embodiment is different from the microcomputer 100A having an embedded flash memory according to the first embodiment in that the ECC activation signal generation circuit 21 has been added thereto and that the ECC activation signal ECCA generated in the ECC activation signal generation circuit 21 is inputted to the decoder portion 13 of the error correction circuit 11. When the ECC activation signal ECCA is on the L level, the microcomputer 100B having an embedded flash memory does not perform data correction irrespective of the values of the syndromes S0 to S6 outputted from the syndrome generator portion 12.

The ECC activation signal generation circuit 21 activates the ECC reset signal /ECCEN_RST with a one-shot pulse formed from the rising edge of the sense amplifier activation signal SAA and thereby inactivates the ECC circuit activation signal ECCA. The ECC activation signal generation circuit 21 retrieves the error detection signal EDS on the falling edge of the ECC clock signal ECCEN_CLK obtained by delaying the sense amplifier activation signal SAA. A description will be given to the operation of the microcomputer 100B having an embedded flash memory described above with reference to the following drawing.

FIG. 8 is a waveform chart for illustrating the operation of the microcomputer 100B having an embedded flash memory of FIG. 7.

Referring to FIG. 8, the address latch signal ADL rises at each of the times t1 to t4 and t6. It is assumed in the same manner as in the first embodiment that data read in each of the read cycles Rcyc1N (times t1 and t2), Rcyc3N (times t3 and t4), and Rcyc4N (times t4 to t6) contains no data and that data read in the read cycle Rcyc2E (times t2 and t3) contains an error.

In any of the read cycles Rcyc1N to Rcyc4N, the set of sense amplifiers 7 generate the data signals D63 to D0 and the parity signals P6 to P0 in response to the rising/falling edge of the sense amplifier activation signal SAA. Thereafter, the output data signals Dout63 to Dout0 in which the error contained in data has been corrected are outputted from the error corrector portion 14 of the error correction circuit 11.

(1) Read Cycles Rcyc1N and Rcyc2E

In the read cycle Rcyc1N, the data (RD1) with no error is read. The data retrieving operation in the read cycles Rcyc1N and Rcyc2E is basically the same as that performed in the first embodiment, except for shifts in the ECC reset signal /ECCEN_RST, the ECC clock signal ECCEN_CLK, and the like, which will be shown below.

In the read cycle Rcyc1N, the ECC reset signal /ECCEN_RST falls in response to the rising edge of the sense amplifier signal SAA. At this time, since the ECC circuit activation signal ECCA has not been activated, there is no shift in the ECC circuit activation signal ECCA.

Thereafter, the ECC clock signal ECCEN_CLK rises in response to the falling edge of the sense amplifier activation signal SAA. However, since the data (RD1) with no error is read in the read cycle Rcyc1N, the ECC circuit activation signal ECCA does not rise.

(2) Read Cycles Rcyc2E and Rcyc3N

In the read cycle Rcyc2E, the data (RD2A) with an error is read. The data retrieving operation in the read cycles Rcyc2E and Rcyc3N is basically the same as that performed in the first embodiment since the ECC circuit activation signal ECCA is activated in overlapping relation with data retrieval in the data buffer 15 and register 16 of the flash memory module I/F circuit 6A, as shown below.

In the read cycle Rcyc2E, the ECC reset signal /ECCEN_RST falls in response to the rising edge of the sense amplifier activation signal, in the same manner as in the read cycle Rcyc1N. At this time, since the ECC circuit activation signal ECCA has not been activated, there is no shift in the ECC circuit activation signal ECCA.

Thereafter, the ECC clock signal ECCEN_CLK rises in response to the falling edge of the sense amplifier activation signal SAA. Since the data (RD2A) with an error is read in the read cycle Rcyc2E, the ECC circuit activation signal ECCA is activated in response to the falling edge of the ECC clock signal ECCEN_CLK.

(3) Read Cycles Rcyc3N and Rcyc4N

In the read cycles Rcyc3N and Rcyc4N, the data signals with no error are read again. In this case, the operation of the microcomputer 100B having an embedded flash memory is basically the same as in the read cycle Rcyc1N. However, in the read cycle Rcyc3N, the influence of the error which was present in the read cycle Rcyc2E remains, though the data read in the read cycle Rcyc3N contains no error. A description will be given to the operation of the microcomputer 100B having an embedded flash memory, which is for the avoidance of the influence.

In the read cycles Rcyc2E and Rcyc3N, the data buffer 15 retrieves the data (RD2B) after error correction from the error corrector portion 14 of the error correction circuit 11 in response to the re-generated rising edge of the data buffer retrieval clock CLKd.

After that, the ECC reset signal /ECCEN_RST falls in response to the rising edge of the sense amplifier activation signal SAA in which the weight WT has been inserted in the read cycle Rcyc3N. At this time, since the ECC circuit activation signal ECCA has been activated, the ECC circuit activation signal ECCA shifts from the H level to the L level in response to the falling edge of the ECC reset signal /ECCEN_RST. That is, the flip-flop circuit 25 which retains the ECC activation signal ECCA is reset in response to a one-shot pulse formed from the rising edge of the sense amplifier activation signal SAA.

As a result of the ECC reset, the output data signals Dout63 to Dout0 retrieved into the data buffer 15 of the flash memory module I/F circuit 6A return from the data (RD2B) corrected once in the read cycle Rcyc2E to the uncorrected data (RD2A) containing an error in the read cycle Rcyc2E. At this time, however, the data (RD2B) after correction in the read cycle Rcyc2E has already been retrieved by the data buffer 15 so that no problem occurs on the operation of the microcomputer 100B having an embedded flash memory. Since the data (RD3) read in the read cycle Rcyc3N thereafter contains no error, it can be retrieved as it is at the time t4.

Thus, the microcomputer having an embedded flash memory according to the second embodiment is a SoC having an embedded semiconductor memory with an error correction circuit using an ECC and comprises: a circuit for outputting an error detection signal which is activated when an error is present in read data; and the semiconductor memory with the error correction circuit having a terminal for controlling the activation/inactivation of error correction. The semiconductor memory is constituted to temporarily inactivate the error correction circuit irrespective of the logic value of the error detection signal, insert the weight only when the logic value of the error detection signal determined thereafter is on the H level, and perform data retrieval again.

In the microcomputer 100A having an embedded flash memory according to the first embodiment, it is necessary to insert the weight WT corresponding to one cycle of the CPU clock even if data with no data has been read in the read cycle subsequent to the read cycle in which data containing an error has been retrieved. This is because correct data does not reach the data buffer only after waiting in consideration of the delay time till the absence of an error in read data is reflected on the output from the decoder of the error correction circuit 11.

By contrast, in the microcomputer 100B having an embedded flash memory according to the second embodiment, on every rising edge of the sense amplifier activation signal SAA, the ECC circuit activation signal ECCA is reset to the L level when it has been activated to the H level. As a result, a transition is made to the state in which the error correction circuit 11 outputs data without performing error correction once on every rising edge of the sense amplifier activation signal SAA.

After data is retrieved by the data buffer 15, the flip-flop circuit 25 receives the error detection signal EDS and outputs the ECC circuit activation signal ECCA on the H or L level. When data retrieval is performed again in the state where the error detection signal EDS is on the L level, data without error correction reaches the data buffer 15. When data retrieval is performed again in the state where the error detection signal EDS is on the H level, data after error correction reaches the data buffer 15.

In addition, the microcomputer 100B having an embedded flash memory according to the second embodiment is also advantageous in terms of the area occupied by the circuits because only one pair of the data latch are provided and there is no portion where a bus for corrected data and a bus for uncorrected data extend in parallel, in the same manner as in the first embodiment.

The type of the memory cell array 8 used in the flash memory module 1 according to the present invention is not limited to a flash memory. The memory cell array 8 may be a nonvolatile memory other than a flash memory and may also be a volatile memory such as a SRAM.

The presently disclosed embodiments are therefore to be considered in all respects as illustrative and not restrictive, the scope of the invention being indicated by the appended claims, rather than the foregoing description of the embodiments, and all changes which come within the meaning and range of equivalency of the claims are therefore intended to be embraced therein.

The present invention is applied to a SoC such as a memory with an ECC, a microcomputer having an embedded memory with an ECC, or the like.

What is claimed is:

1. A semiconductor device comprising:
a memory cell array for storing data signals and parity signals;
sense amplifiers for reading the stored data signals and the stored parity signals;
an error correction circuit for receiving the read data signals and the read parity signals and correcting an error contained in the data signals; and
a memory module interface circuit for retrieving output data signals outputted from the error correction circuit and outputting the output data signals to a data bus,
wherein the error correction circuit includes:
a syndrome generator portion for combining the read data signals and the read parity data signals with each other to generate syndrome signals;
a decoder portion for specifying an error bit in the data signals from the syndrome signals; and
an error corrector portion for correcting the error in the data signals based on output signals from the decoder portion,
wherein the memory module interface circuit includes:
a data retrieval clock generator portion for generating a data buffer retrieval clock signal giving a timing for retrieving the output data signals, and an error detection signal determination clock signal for giving a timing for determining whether or not an error is contained in the data signals; and
a data buffer for retrieving the output data signals in response to the data buffer retrieval clock signal,
the semiconductor device further comprising:
an error detector portion for detecting whether or not an error is contained in the data signals; and
a sense amplifier activation signal generator portion for generating a sense amplifier activation signal activating an operation of each of the sense amplifiers,
wherein when the error detection signal has been activated at a time at which the error detection signal determination clock signal shifts, each of the data buffer retrieval clock and the sense amplifier activation signal is delayed by a specified time.

2. The semiconductor device according to claim 1, wherein, when the error detection signal has been activated at the time at which the error detection signal determination clock signal shifts, the sense amplifier activation signal is delayed by the specified time by generating the data buffer retrieval clock after the specified time.

3. The semiconductor device according to claim 2, wherein the specified time corresponds to one clock cycle of a control clock signal for controlling an operation of each of the data retrieval clock generator portion and the sense amplifier activation signal generator portion.

4. The semiconductor device according to claim 1, wherein, when the error detection signal shifts from an active state to an inactive state at the time at which the error detection signal determination clock signal shifts between a previous read cycle and a current read cycle, each of the data buffer retrieval clock and the sense amplifier activation signal is delayed by the specified time.

5. The semiconductor device according to claim 4, wherein, when the error detection signal shifts from the active state to the inactive state at the time at which the error detection signal determination clock signal shifts between the previous read cycle and the current read cycle, the sense amplifier activation signal is delayed by the specified time by generating the data buffer retrieval clock after the error corrector portion completes error correction.

6. The semiconductor device according to claim 5, wherein the specified time corresponds to one clock cycle of a control clock signal for controlling an operation of each of the data retrieval clock generator portion and the sense amplifier activation signal generator portion.

7. The semiconductor device according to claim 4, wherein the specified time corresponds to one clock cycle of a control clock signal for controlling an operation of each of the data retrieval clock generator portion and the sense amplifier activation signal generator portion.

8. The semiconductor device according to claim 1,
wherein the data retrieval clock generator portion generates a register retrieval clock signal for giving a timing for retrieving an output signal from the data buffer in synchronization with the sense amplifier activation signal, and
wherein the memory module interface circuit further includes a register for retrieving the output signal from the data buffer in response to the register retrieval clock signal.

9. The semiconductor device according to claim 8, wherein the specified time corresponds to one clock cycle of a control clock signal for controlling an operation of each of the data retrieval clock generator portion and the sense amplifier activation signal generator portion.

10. The semiconductor device according to claim 1, wherein the error detector portion includes:
- a logical OR stage for performing a logical OR operation with respect to the syndrome signals and thereby outputting the error detection signal indicative of whether or not an error is contained in the data signals; and
- a buffer stage for buffering the error detection signal and outputting the buffered error detection signal to each of the data retrieval clock generator portion and the sense amplifier activation signal generator portion.

11. The semiconductor device according to claim 10, wherein the specified time corresponds to one clock cycle of a control clock signal for controlling an operation of each of the data retrieval clock generator portion and the sense amplifier activation signal generator portion.

12. The semiconductor device according to claim 1, further comprising:
- an error correction activation signal generation circuit for receiving the error detection signal in response to the sense amplifier activation signal and outputting an error correction activation signal for controlling an operation of the decoder portion to the decoder portion, wherein the error correction activation signal generation circuit outputs, when the sense amplifier activation signal is activated, the error correction activation signal for controlling activation and inactivation of the error corrector portion to the decoder portion based on each of the error detection signal and the sense amplifier activation signal, and the decoder portion outputs a signal for inactivating the error corrector portion when the error correction activation signal is inactivated and inputted thereto.

13. The semiconductor device according to claim 12, wherein the error correction activation signal generation circuit includes:
- a flip-flop circuit which retrieves the error detection signal in synchronization with a signal obtained by delaying the sense amplifier activation signal by the specified time, outputs the error correction activation signal to the decoder portion, and is reset in synchronization with the sense amplifier activation signal.

14. The semiconductor device according to claim 13, wherein the specified time corresponds to one clock cycle of a control clock signal for controlling an operation of each of the data retrieval clock generator portion and the sense amplifier activation signal generator portion.

15. The semiconductor device according to claim 12, wherein the specified time corresponds to one clock cycle of a control clock signal for controlling an operation of each of the data retrieval clock generator portion and the sense amplifier activation signal generator portion.

16. The semiconductor device according to claim 1, wherein the specified time corresponds to one clock cycle of a control clock signal for controlling an operation of each of the data retrieval clock generator portion and the sense amplifier activation signal generator portion.

* * * * *